United States Patent
Sakuma

(10) Patent No.: US 7,319,607 B2
(45) Date of Patent: Jan. 15, 2008

(54) FERROELECTRIC MEMORY

(75) Inventor: Shinzo Sakuma, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 92 days.

(21) Appl. No.: 11/356,167

(22) Filed: Feb. 17, 2006

(65) Prior Publication Data

US 2006/0268597 A1  Nov. 30, 2006

(30) Foreign Application Priority Data

May 25, 2005  (JP) ............................. 2005-152069

(51) Int. Cl.
  *G11C 11/22*  (2006.01)
(52) U.S. Cl. ................... 365/145; 365/189.09
(58) Field of Classification Search ................ 365/145, 365/189.09, 207, 203
  See application file for complete search history.

(56) References Cited

U.S. PATENT DOCUMENTS 5,619,470 A * 4/1997 Fukumoto ................. 365/228
5,963,467 A * 10/1999 Miyatake et al. ........... 365/149
6,965,520 B1 * 11/2005 Seshadri et al. ............ 365/145
7,064,972 B2 * 6/2006 Takashima .................. 365/145

FOREIGN PATENT DOCUMENTS

| JP | 05-114741 | 5/1993 |
| JP | 06-223583 | 8/1994 |
| JP | 07-111085 | 4/1995 |
| JP | 2000-076870 | 3/2000 |
| JP | 3110032 | 9/2000 |

* cited by examiner

*Primary Examiner*—Anh Phung
(74) *Attorney, Agent, or Firm*—Volentine & Whitt, P.L.L.C.

(57) ABSTRACT

A ferroelectric memory, upon reading of a memory cell array, in which the plate line PL is charged to the power supply potential VDD by a driving control circuit prior to driving of the relevant word line WL. The bit lines BL and /BL are charged to the potential VDD by a timing control circuit, then the word line WL is driven. At this time, the lines BL and /BL are discharged by applying an equalizing signal EQ with predetermined pulse width to a reset circuit.

15 Claims, 12 Drawing Sheets

FIG. 4A – PRIOR ART –
EQUIVALENT CIRCUIT
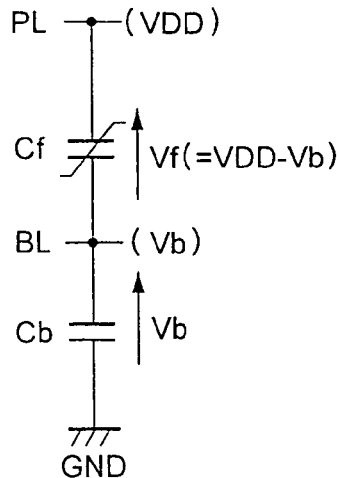
FIG. 4B – PRIOR ART –
HYSTERESIS CHARACTERISTIC
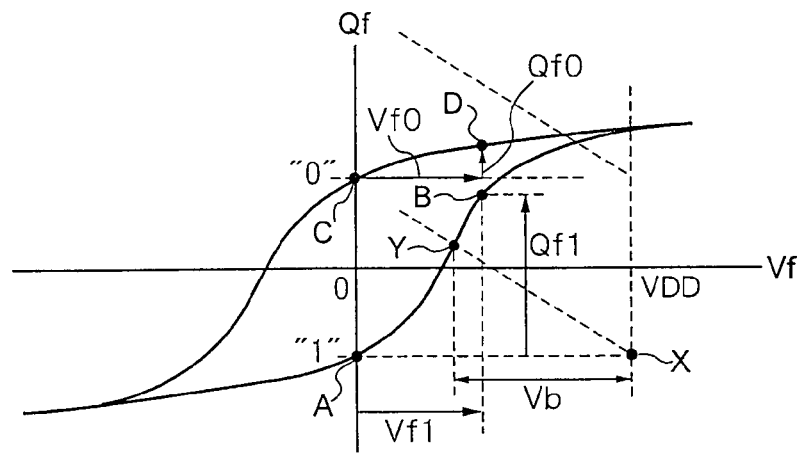
FIG. 4C – PRIOR ART –
OPERATION AT LOW VOLTAGE
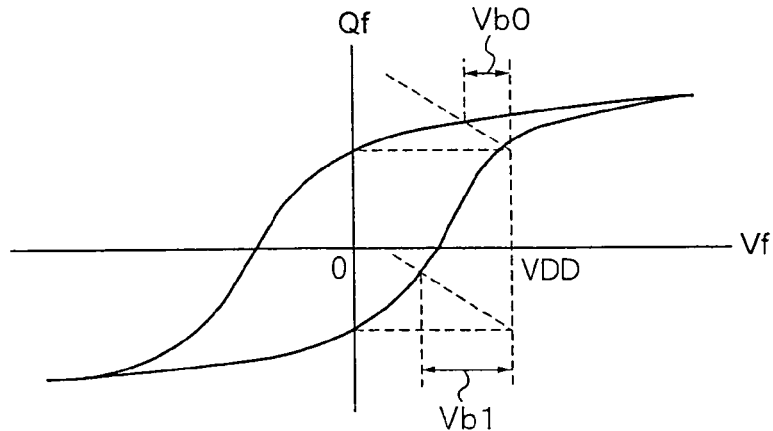

EQUIVALENT CIRCUIT

HYSTERESIS TRANSITION AT HIGH SUPPLY POTENTIAL

HYSTERESIS TRANSITION AT LOW SUPPLY POTENTIAL

FERROELECTRIC MEMORY

BACKGROUND OF THE INVENTION

1. Field of the Invention

The present invention relates to a nonvolatile ferroelectric memory, and in particular to a technology for improving reading characteristics with a low power supply voltage.

2. Description of the Related Art

FIG. 2 schematically shows the configuration of a conventional ferroelectric memory.

The ferroelectric memory includes a memory cell array 10 provided to correspond to a pair of complementary bit lines BL and /BL, a reset circuit 20, and a sense amp 30. The memory cell array 10 includes a plurality of word lines WLi and plate lines PLi (where i=0 to n), arranged to intersect the bit lines BL and /BL. Sense transistors Mai and ferroelectric capacitors Cai are connected in series between the bit line BL and the plate lines PLi, and cell transistors Mbi and ferroelectric capacitors Cbi are connected in series between the bit line /BL and the plate line PLi. The gates of the cell transistors Mai, Mbi are connected to the word lines WLi.

The ferroelectric capacitors Cai, Cbi have hysteresis characteristics, in which a remanent polarization occurs even when the electric field is decreased to zero after applying an electric field across the electrodes. The remanent polarization is used to store data. Specifically, the remanent polarizations of opposite polarity, which are induced in a pair of ferroelectric capacitors Cai, Cbi corresponding to one word line WLi, are used to store one bit of data.

The reset circuit 20 sets the bit lines BL and /BL to ground potential GND prior to reading data, to discharge the electric charge accumulated in the parasitic capacitance between the bit lines BL and /BL and the ground potential GND. The sense amp 30 amplifies the potential difference output to the bit lines BL and /BL from the ferroelectric capacitors Cai, Cbi when data is read, and outputs complementary signals having predetermined logic levels "H" and "L" to the bit lines BL and /BL.

FIG. 3 shows signal waveforms for a reading operation of the ferroelectric memory of FIG. 2.

At standby (time t0), none of the word lines WLi or the plate lines PLi are selected, and thus all the lines are set to the level "L". On the other hand, an equalizing signal EQ of "H" is applied to the reset circuit 20, and the bit lines BL and /BL are connected to ground potential GND and set to be "L". An enable signal SE of "L" is applied to the sense amp 30, halting operation of the sense amp 30.

When the reading operation is started at time t1, the equalizing signal EQ is set to "L", and one word line (here, WL0) is selected and driven to a word line potential VWL according to an address signal(not shown). The word line potential VWL is a potential equal to or higher, by the threshold voltage of the cell transistor M, than the power supply potential VDD. By setting the equalizing signal EQ to "L", the operation of the reset circuit 20 is stopped, and the bit lines BL and /BL enter a floating state.

At time t2, the plate line PL0 is driven to the power supply potential VDD. As a result, a potential appears on the bit line BL which is voltage-divided by the parasitic capacitance between the bit line BL and the ground potential GND, and the ferroelectric capacitor Ca0. On the bit line /BL, a potential appears which is voltage-divided by the parasitic capacitance between the bit line /BL and the ground potential GND, and the ferroelectric capacitor Cb0. Because remanent polarizations of opposite polarity remain on the ferroelectric capacitors Ca0 and Cb0, the potential increases of the two bit lines BL and /BL differ.

At time t3, the enable signal SE goes to "H", and operation of the sense amp 30 is started, at which time the potential difference between the bit lines BL and /BL is amplified, and the levels of the bit lines BL and /BL become, for example, "H" and "L", respectively. As a result, the data stored in the ferroelectric capacitors Ca0 and Cb0 is output to the bit lines BL and /BL.

At time t4, the plate line PL0 is returned to ground potential GND. The potentials of the bit lines BL and /BL are respectively applied to the ferroelectric capacitors Ca0, Cb0, to perform rewriting of the ferroelectric capacitors Ca0, Cb0.

Then, at time t5, the enable signal SE goes to "H" and operation of the sense amp 30 is stopped, and at time t6, the word line WL0 goes to "L" and the data reading operation is stopped.

Ferroelectric memories employing a data reading method by means of voltage division between the parasitic capacitance between bit lines BL and the ground potential GND, and a ferroelectric capacitor Ca0, are described in Japanese Patent Applications Kokai No. 5-114741, No. 6-223583, No. 7-111085, No. 2000-76870, and the Japanese Patent No. 3110032.

As described above, ferroelectric memory utilizes the polarization of ferroelectric capacitors, so that when stored data is read out, the data can be read by applying a sufficient potential difference to the ferroelectric capacitors. However, in order to reduce the power consumption, attempts are made to decrease the power supply potential VDD, and it becomes difficult to apply a sufficient potential difference to the ferroelectric capacitors.

FIGS. 4A-4C illustrate problems relating to readout in a conventional ferroelectric memory.

At the time of a read operation, the equivalent circuit of a memory cell in FIG. 2 is such that, as indicated in FIG. 4A, one end of a ferroelectric capacitor Cf is connected to the plate line PL at the power supply potential VDD, and the other end is connected to the bit line BL; further, the bit line BL is connected, via the parasitic capacitance Cb, to ground potential GND. When the read operation is started (for example, at time t2 in FIG. 3), the bit line BL is at ground potential GND and in a floating state, and the power supply potential VDD is applied to the plate line PL. As a result, the power supply potential VDD applied to the plate line PL is voltage-divided by the parasitic capacitance Cb between the ferroelectric capacitor Cf and the bit line BL, and the voltage Vb of the parasitic capacitance Cb becomes the read-out potential. The voltage Vf of the ferroelectric capacitor Cf is VDD−Vb. At this time, the ferroelectric capacitor Cf and parasitic capacitance Cb are connected in series, so that the charges Qf, Qb accumulated in each are the same.

As shown in FIG. 4B, the relation between the voltage Vf applied to the ferroelectric capacitor Cf and the charge Qf has a hysteresis characteristic. When, in the initial state A in which data "1" is stored, a voltage Vf1 is applied to perform reading, the charge on the ferroelectric capacitor Cf increases by Qf1, to enter state B. Hence the capacitance of the ferroelectric capacitor Cf is Qf1/Vf1, that is, the slope of the straight line connecting points A and B. On the other hand, when, while in an initial state C in which data "0" is written a voltage Vf0 is applied for reading, the charge on the ferroelectric capacitor Cf increases by Qf0, to enter state D. Hence the capacitance of the ferroelectric capacitor Cf is Qf0/Vf0, that is, the slope of the straight line connecting points C and D. Thus the capacitance of the ferroelectric capacitor Cf takes on different values depending on the charge on the capacitor and the voltage applied.

On the other hand, the parasitic capacitance Cb of the bit line BL is a paraelectric capacitance which does not have a hysteresis characteristic. Thus, the capacitance is constant and not affected by the applied voltage. Hence as indicated by the broken line in FIG. 4B, the voltage Vb applied to the parasitic capacitance Cb and the charge Qb are linearly related, and the relation has a constant slope.

Here, the voltage Vb (readout potential) appearing on a bit line BL storing, for example, a data "1" when the power supply potential VDD is applied to the plate line PL is determined. First, from the conditions that the sum of the voltage Vf on the ferroelectric capacitor Cf and the voltage Vb appearing on the parasitic capacitance Cb is VDD, and that the charges Qf and Qb accumulated in the capacitances are equal, as shown in FIG. 4B, an additional line is drawn, passing through the point X at which the voltage is VDD and the charge is the same as at point A, and having a negative slope of the same magnitude as the parasitic capacitance Cb. When the intersection point of the additional line with the hysteresis curve for ferroelectric capacitor Cf is denoted Y, then the potential difference between points X and Y is the voltage Vb appearing on the bit line BL. The read-out potential appearing on the bit line /BL when data "0" is stored can be determined by a similar procedure.

In FIG. 4B, a case is shown in which the power supply potential VDD applied to the plate line PL is comparatively large; the difference in read-out potentials output to the bit lines BL and /BL for data "1" and for data "0" can be made comparatively large.

However, as shown in FIG. 4C, the difference Vb1–Vb0 in read-out potentials output to the bit lines BL and /BL for data "1" and for data "0" decreases when the power supply potential VDD applied to the plate line PL becomes low, the read margin is reduced, and there is a greater possibility of an erroneous reading operation.

SUMMARY OF THE INVENTION

Accordingly, it is an object of the present invention to provide ferroelectric memory enabling error-free data reading even at low power supply voltages.

A ferroelectric memory of the present invention includes a memory cell array, having complementary first and second bit lines, a plurality of sets of a word line and a plate line provided to intersect the bit lines, and a ferroelectric capacitor, connected via a transistor which is controlled to turn on and off by the corresponding word line between the first and second bit lines and a plate line. A reset circuit is provided, which connects the first and second bit lines to ground potential while an equalizing signal is being applied. A precharge circuit connects the first and second bit lines to the power supply potential while a precharge signal is being applied. A sense amp amplifies the potential difference between the first and second bit lines, and outputs signals at complementary first and second logic levels to these first and second bit lines, while an enable signal is being applied. A driving control means, at read and write access times of the memory cell array, drives the relevant plate line according to an applied address signal, and drives the corresponding word line after a predetermined time elapses; and a timing control means, which outputs the equalizing signal when there is no access, outputs the precharge signal while halting the equalizing signal when access is begun, halts the precharge signal before the predetermined time elapses, outputs the equalizing signal with a predetermined pulse width after a fixed time elapses from the start of driving of the word line, and after the equalizing signal is halted outputs the enable signal.

In the present invention, when accessing (particularly reading) the memory array, the plate line is driven and the bit lines are charged to the power supply potential before driving the word line, after which the word line is driven, and at this time an equalizing signal of predetermined pulse width causes the bit lines to be discharged. As a result, the potential difference appearing across the bit lines no longer depends on the parasitic capacitance of the bit lines, and a greater potential difference can be obtained. Hence the read margin at low power supply voltages is increased, and there is an advantage that data reading can be performed without errors even at low power supply voltages.

A parallel-bit ferroelectric memory is configured by providing a first memory cell array, based on a so-called 2T2C type memory cell array having ferroelectric capacitors connected via transistors controlled to turn on and off by the same word line between first and second complementary bit lines and a plate line, and by making the remaining second through m-th memory arrays so-called 1T1C type memory cell arrays, having ferroelectric capacitors connected via transistors between a first or second bit line and a plate line.

BRIEF DESCRIPTION OF THE DRAWINGS

FIG. 4A-4C illustrate problems during reading in ferroelectric memory of the prior art;

DETAILED DESCRIPTION OF THE INVENTION

The above and other objects and novel features of the present invention will become clearer through the following descriptions of preferred embodiments, in conjunction with the attached drawings. However, the drawings are principally for the purpose of explication, and do not limit the scope of the invention.

First Embodiment

Figure 1:
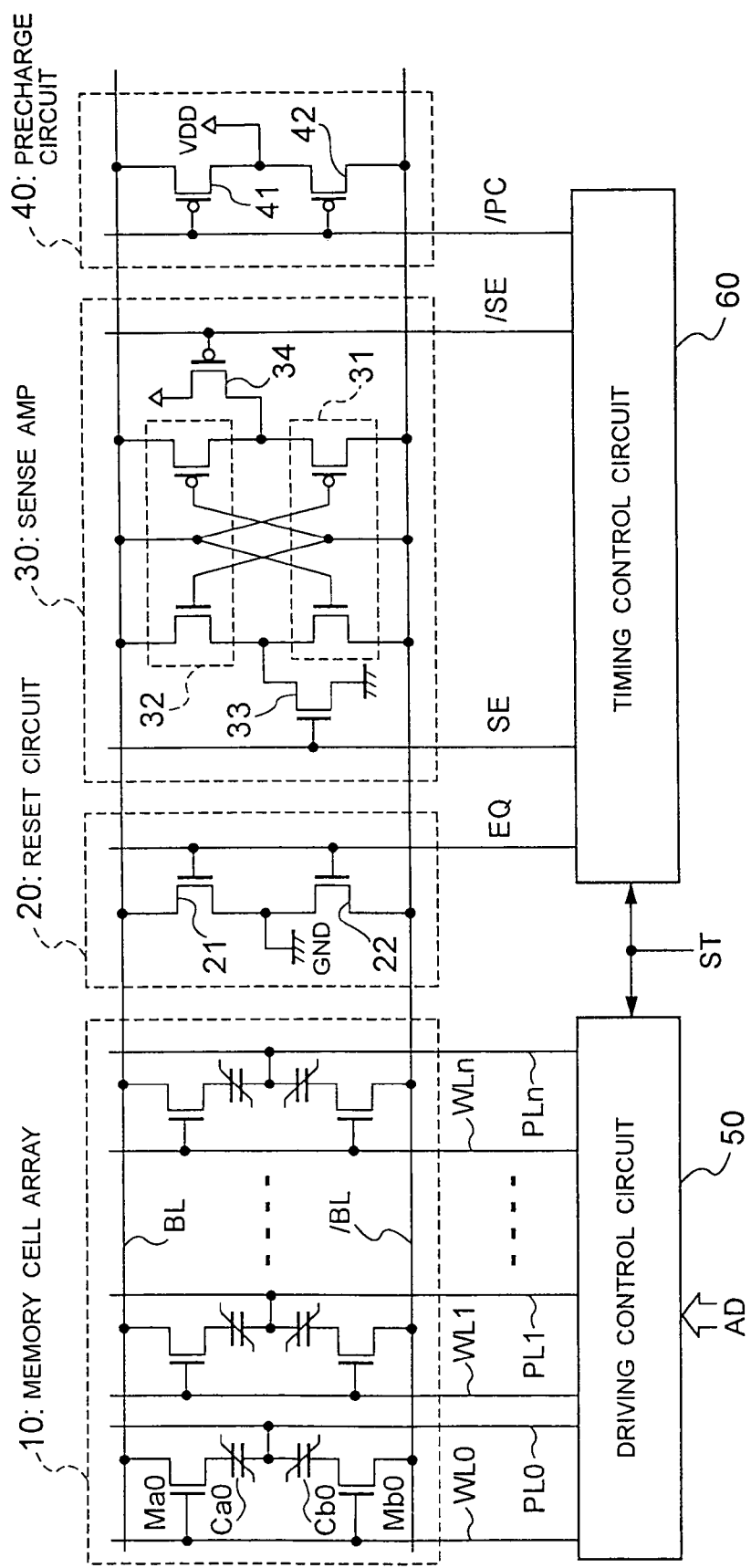
FIG. 1 shows the configuration of a ferroelectric memory in a first embodiment of the present invention.
Figure 2:
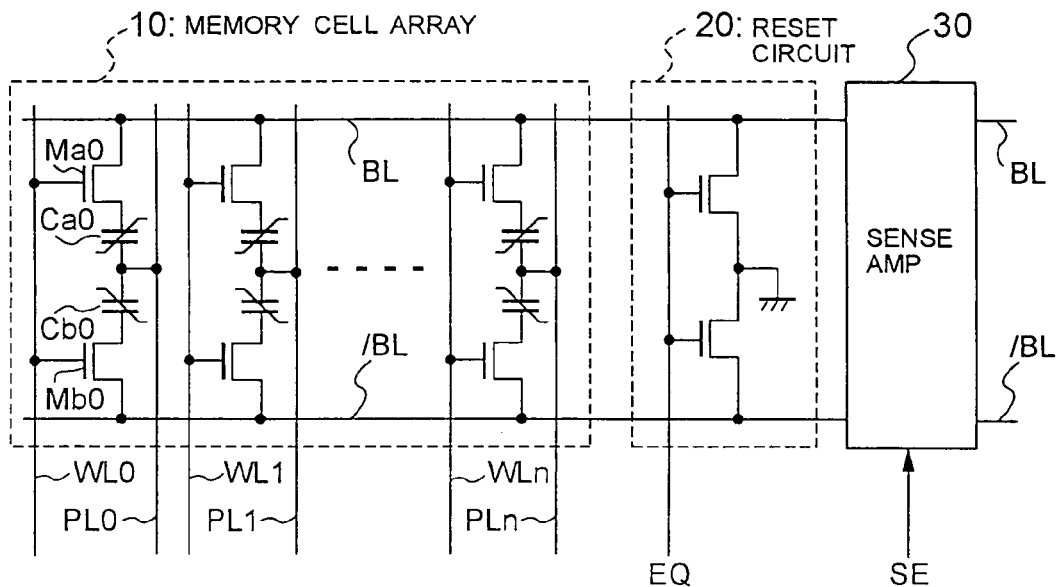
FIG. 2 schematically shows the configuration of a conventional ferroelectric memory.
Figure 3:
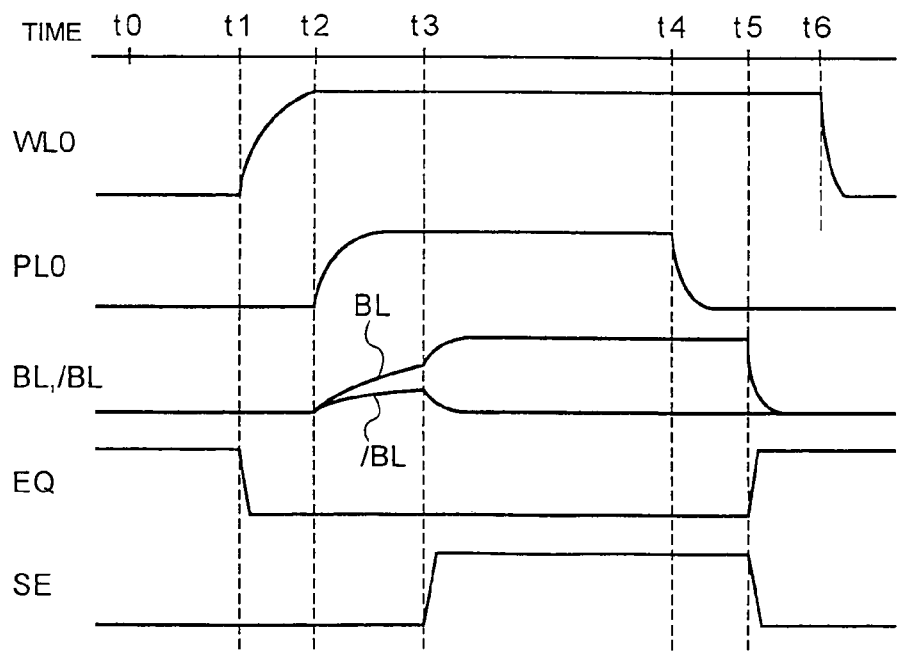
FIG. 3 is a signal waveform diagram showing read operation in the ferroelectric memory of FIG. 2.

FIG. 1 shows the configuration of a ferroelectric memory in a first embodiment of the present invention in which the portions common to portions in FIG. 2 are assigned common symbols.

The ferroelectric memory includes a memory cell array 10 provided correspondingly to a pair of complementary bit lines BL and /BL, a reset circuit 20, a sense amp 30, and a precharge circuit 40, a driving control circuit 50 which generates driving signals for the memory cell array 10, and a timing control circuit 60 which outputs control signals at predetermined timings to the reset circuit 20, sense amp 30 and precharge circuit 40.

The memory cell array 10 has a plurality of word lines WLi and plate lines PLi (where i=0 to n), arranged to intersect with the bit lines BL and /BL. Cell transistors Mai and ferroelectric capacitors Cai are connected in series between the bit line BL and the plate lines PLi, and cell transistors Mbi and ferroelectric capacitors Cbi are connected in series between the bit line /BL and the plate lines PLi. The gates of the cell transistors Mai, Mbi are connected to the word lines WLi. The word lines WLi and the plate lines PLi are connected to the driving control circuit 50. The driving control circuit 50 interprets address signals AD and drives the word lines WLi and the plate lines PLi at a predetermined timing.

The reset circuit 20 sets the bit lines BL and /BL to ground potential GND when driven by an equalizing signal EQ, to discharge the charge accumulated in the parasitic capacitance between these bit lines BL and /BL and ground potential GND. The reset circuit 20 comprises N-channel MOS (hereafter "NMOS") transistors 21, 22, connected between the bit lines BL, /BL and ground potential GND, so that the equalizing signals EQ are applied to the gates of the NMOS transistors 21, 22.

Upon data reading, the sense amp 30 amplifies the potential difference output to the bit lines BL and /BL from the ferroelectric capacitors Cai, Cbi, and outputs complementary signals having predetermined logic levels "H" and "L" to the bit lines BL and /BL. The sense amp 30 includes a CMOS inverter 31, which inverts the level of the bit line BL and outputs the result to the bit line /BL; a CMOS inverter 32, which inverts the level of the bit line /BL and outputs the result to the bit line BL; and an NMOS transistor 33 and P-channel MOS (hereafter "PMOS") transistor 34, for switching to control the power supply to the CMOS inverters 31 and 32. Complementary enable signals SE and /SE are applied to the gates of the NMOS transistor 33 and PMOS transistor 34.

The precharge circuit 40 sets the bit lines BL and /BL to the power supply potential VDD when driven by the precharge signal /PC, to charge the parasitic capacitances between the bit lines BL, /BL and the ground potential GND. The precharge circuit 40 comprises PMOS transistors 41, 42 connected between the bit lines BL, /BL and the power supply potential VDD; the precharge signal /PQ is applied to the gates of the PMOS transistors 41, 42.

When an operation start signal ST is supplied, the timing control circuit 60 generates an equalizing signal EQ, enable signals SE and /SE, and a precharge signal /PC with a predetermined timing, applying the signals to the reset circuit 20, the sense amp 30, and the precharge circuit 40, respectively.

Figure 5:
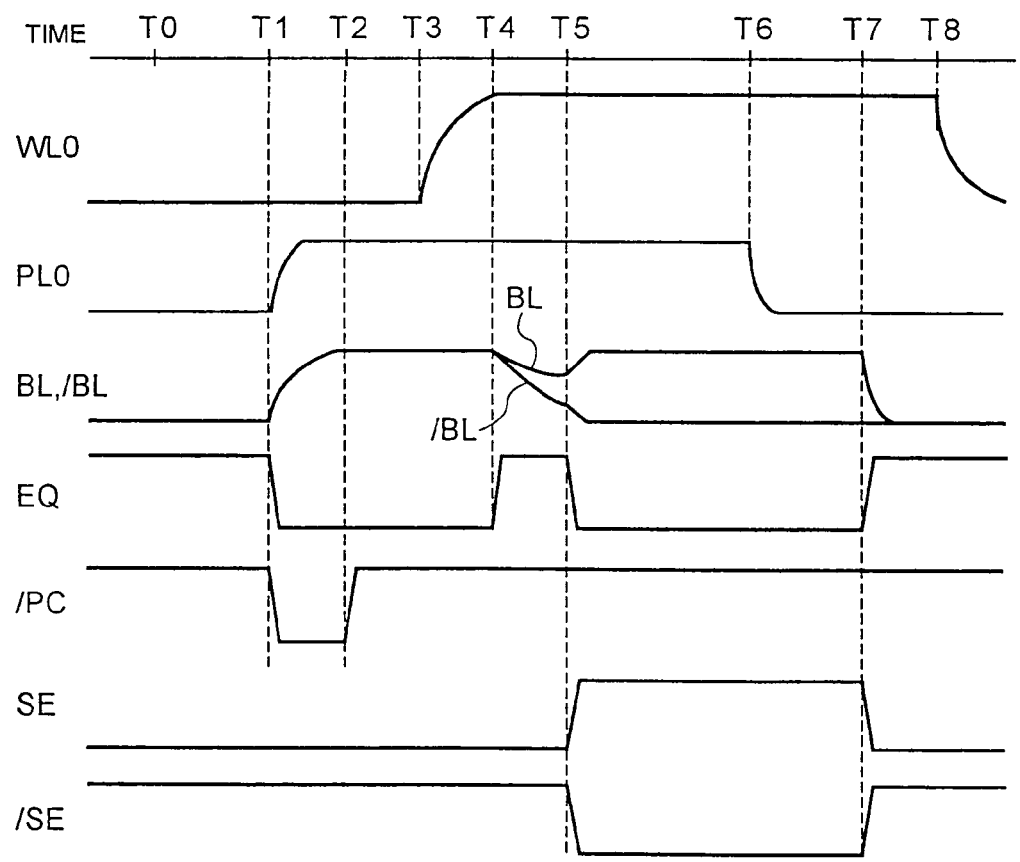
FIG. 5 is a signal waveform diagram showing a read operation in the ferroelectric memory of FIG. 1.

FIG. 5 is a signal waveform diagram showing a read operation in the ferroelectric memory of FIG. 1.

During standby (at time T0), neither the word line WLi nor the plate line PLi are selected, and are both at "L". On the other hand, an "H" equalizing signal EQ is applied to the reset circuit 20, and the bit lines BL and /BL are connected to ground potential GND and go to "L". The sense amp 30 are supplied with enable signals SE and /SE of "L" and "H" levels, respectively, halting operation of the sense amp 30. Further, an "H" precharge signal /PC is applied to the precharge circuit 40, halting operation of the precharge circuit 40.

At time T1, when the read operation is started by a start signal ST, the driving control circuit 50 decodes the address signal AD and drives the relevant plate line (here, assumed to be PL0) to "H". On the other hand, the timing control circuit 60 makes the equalizing signal EQ and the precharge signal /PC to be "L". As a result of the change to "L" level of the equalizing signal EQ and the precharge signal /PC, operation of the reset circuit 20 is halted, and the precharge circuit 40 starts operation. As a result, the bit lines BL and /BL rise from ground potential GND to the power supply potential VDD.

At time T2, the precharge signal /PC is changed to "H", and operation of the precharge circuit 40 stops. As a result, the bit lines BL and /BL enter a floating state, but the parasitic capacitances of the bit lines BL and /BL are charged to "H", so that the bit lines BL and /BL are maintained at "H" level.

At time T3, the driving control circuit 50 drives the word line WL0 corresponding to the plate line PL0 to the word line potential VWL. The word line potential VWL is a potential higher than the power supply potential VDD by at least the threshold voltage of the cell transistor M. As a result, the cell transistors Ma0, Mb0 enter the turned-on state, but the plate line PL0 is at "H" and the bit lines BL and /BL are in a floating "H" state, so that no fluctuation in potential occurs.

At time T4, the equalizing signal EQ is changed to "H" by the timing control circuit 60. As a result, the bit lines BL and /BL are connected to ground potential GND by the reset circuit 20, and the charge which had accumulated in the parasitic capacitances of the bit lines BL and /BL is discharged, so that the potentials drop. At this time, the bit lines BL and /BL are connected to the ferroelectric capacitors Ca0, Cb0, in which remanent polarizations of opposite polarity have been maintained, via the cell transistors Ma0, Mb0, which have entered the turned-on state. Consequently the potential rates decline of the bit lines BL and /BL differ due to the remanent polarizations of the ferroelectric capacitors Ca0 and Cb0.

At time T5, the equalizer signal EQ is changed to "L" by the timing control circuit 60, and the enable signals SE, /SE are changed to "H" and "L" respectively. As a result, the bit lines BL and /BL are disconnected from ground potential GND, and the potential difference between the bit lines BL and /BL is given as an input signal to the sense amp 30. The potential difference between the bit lines BL and /BL is amplified by the sense amp 30, so that the levels of the bit lines BL and /BL become, for example, "H" and "L". As a result, the data which had been stored in the ferroelectric capacitors Ca0 and Cb0 is output to the bit lines BL and /BL.

At time T6, the plate line PL0 is returned to ground potential GND. As a result, the potentials of the bit lines BL and /BL are applied to the ferroelectric capacitors Ca0 and Cb0 respectively, so that rewriting of the ferroelectric capacitors Ca0 and Cb0 is performed.

Thereafter, at time T7, the equalizing signal EQ is changed to "H", and the enable signals SE and /SE are changed to "L" and "H" respectively. As a result the bit lines BL and /BL go to "L", and operation of the sense amp 30 halts. Then, at time T8, the word line WL0 is changed to "L" by the driving control circuit 50, and the data read operation is ended.

Figure 6A:
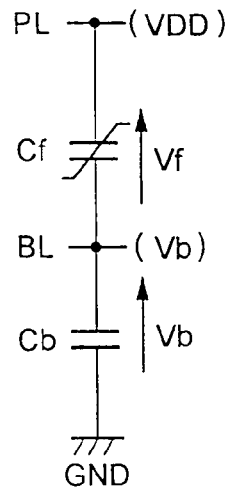
FIGS. 6A-6C illustrate the equivalent circuit and state transition diagrams during a read operation of the ferroelectric memory of FIG. 1.
Figure 6B:
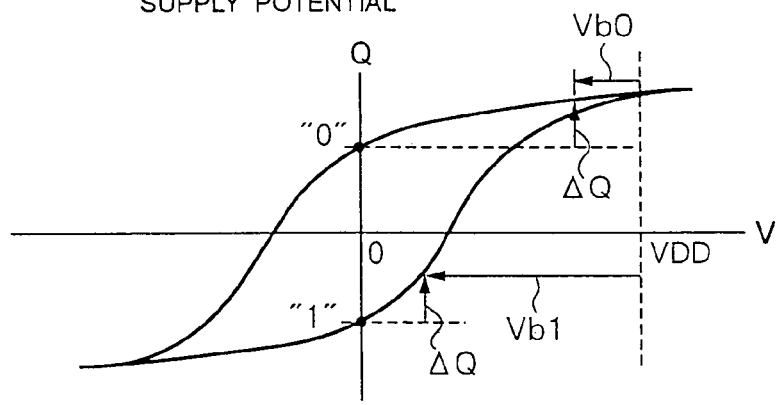
Figure 6C:
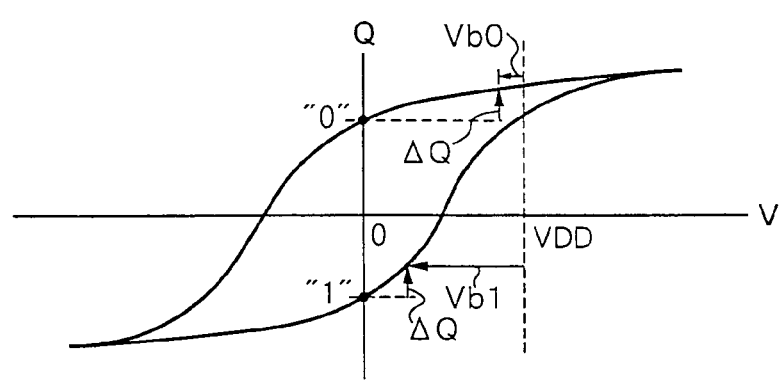

FIG. 6A shows the equivalent circuit of the memory cell of FIG. 1. FIGS. 6B and 6C illustrate state transition diagrams during a read operation of the ferroelectric memory of FIG. 1. FIG. 6B illustrates the hysteresis transition when the power supply voltage VDD is high, and FIG. 6C illustrates the hysteresis transition when the power supply voltage VDD is low.

At time T4, the bit lines BL and /BL are connected to ground potential GND by the reset circuit 20. When the charge which had accumulated on the bit lines BL and /BL is discharged, the charge and voltage of the ferroelectric capacitors Ca0 and Cb0 changes according to the hysteresis curve.

The charge amount ΔQ, which until time T5 had increased and decreased, becomes equal on the ferroelectric capacitor which had been storing data "0" (for example, Ca0) and on the ferroelectric capacitor which had been storing data "1" (for example, Cb0). Hence the potential change becomes large in the region where the slope of the hysteresis curve is small, and the potential change is small in the region where the slope is large. Thus the occurrence of a potential difference does not depend on the parasitic capacitance of the bit lines, so that a large potential difference is obtained between the bit lines BL and /BL even when the power supply potential VDD is low.

A data write operation is performed by forced complementary driving of the bit lines BL and /BL based on the write data from a data writing circuit, not shown (a circuit having greater driving capacity than the sense amp 30), during the time period from time T5 to time T6 in FIG. 5.

In this way, the ferroelectric memory of the first embodiment has a precharge circuit 40 which precharges the bit lines BL and /BL to the power supply potential VDD before driving of the word line WLi at the start of a read operation, and a reset circuit 20 which connects the bit lines BL and /BL to ground potential GND for a fixed length of time after the driving of the word line WLi. As a result, when the bit lines BL and /BL are grounded for a fixed length of time, the potential difference occurring between the bit lines BL and /BL no longer depends on the parasitic capacitances of the bit lines. Hence even if the power supply potential VDD is lowered, a read margin can be secured, and so there is the advantage that data reading can be performed without error even with a low power supply voltage.

Second Embodiment

Figure 7:
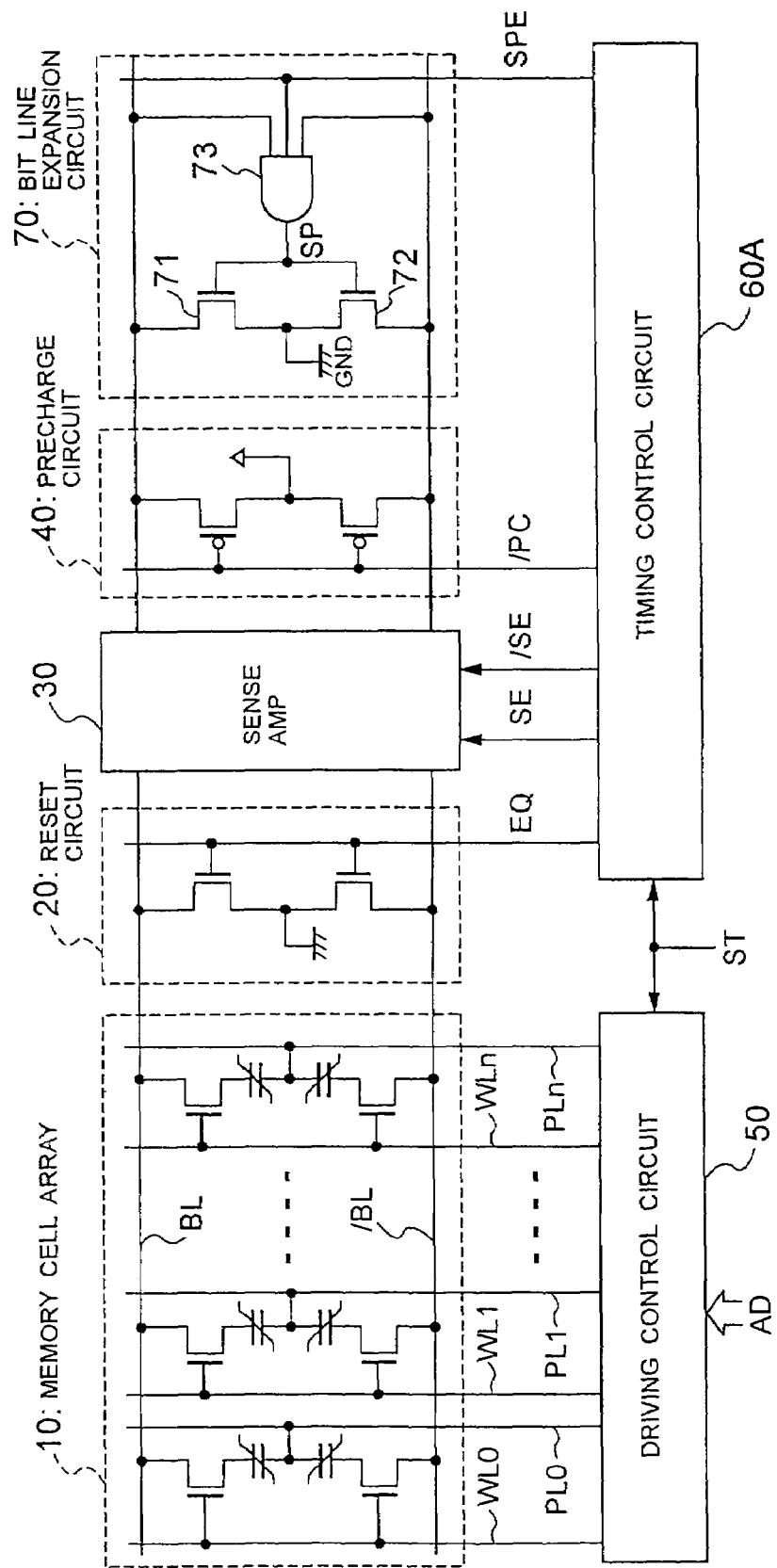
FIG. 7 shows the configuration of ferroelectric memory in a second embodiment of the present invention.

FIG. 7 shows the configuration of ferroelectric memory in a second embodiment of the present invention. Portions which are common to portions in FIG. 1 are assigned common symbols.

In the ferroelectric memory, a bit line expansion circuit 70, which is a second reset circuit, is added to the ferroelectric memory of FIG. 1, and in place of the timing control circuit 60 in FIG. 1, a timing control circuit 60A, which generates control signals with somewhat different timing, is provided.

The bit line expansion circuit 70 is a circuit which connects the bit lines BL and /BL to ground potential GND while the bit lines BL and /BL are both at "H", when the bit line expansion signal SPE as a second equalizing signal is applied by the timing control circuit 60A, and discharges the charge accumulated in the parasitic capacitances of the bit lines BL and /BL. That is, the bit line expansion circuit 70 comprises NMOS transistors 71, 72 connected between the respective bit lines BL and /BL and ground potential GND, and a three-input logical product gate (hereafter "AND circuit") 73 which applies the logical product of the bit lines BL and /BL and bit line expansion signal SPE to the gates of the NMOS transistors 71, 72 as the signal SP, which is a third equalizing signal.

The timing control circuit 60A generates a bit line expansion signal SPE for the bit line expansion circuit 70, and changes the timing of the equalizing signal EQ for the reset circuit 20. Otherwise the configuration is the same as in FIG. 1.

Figure 8:
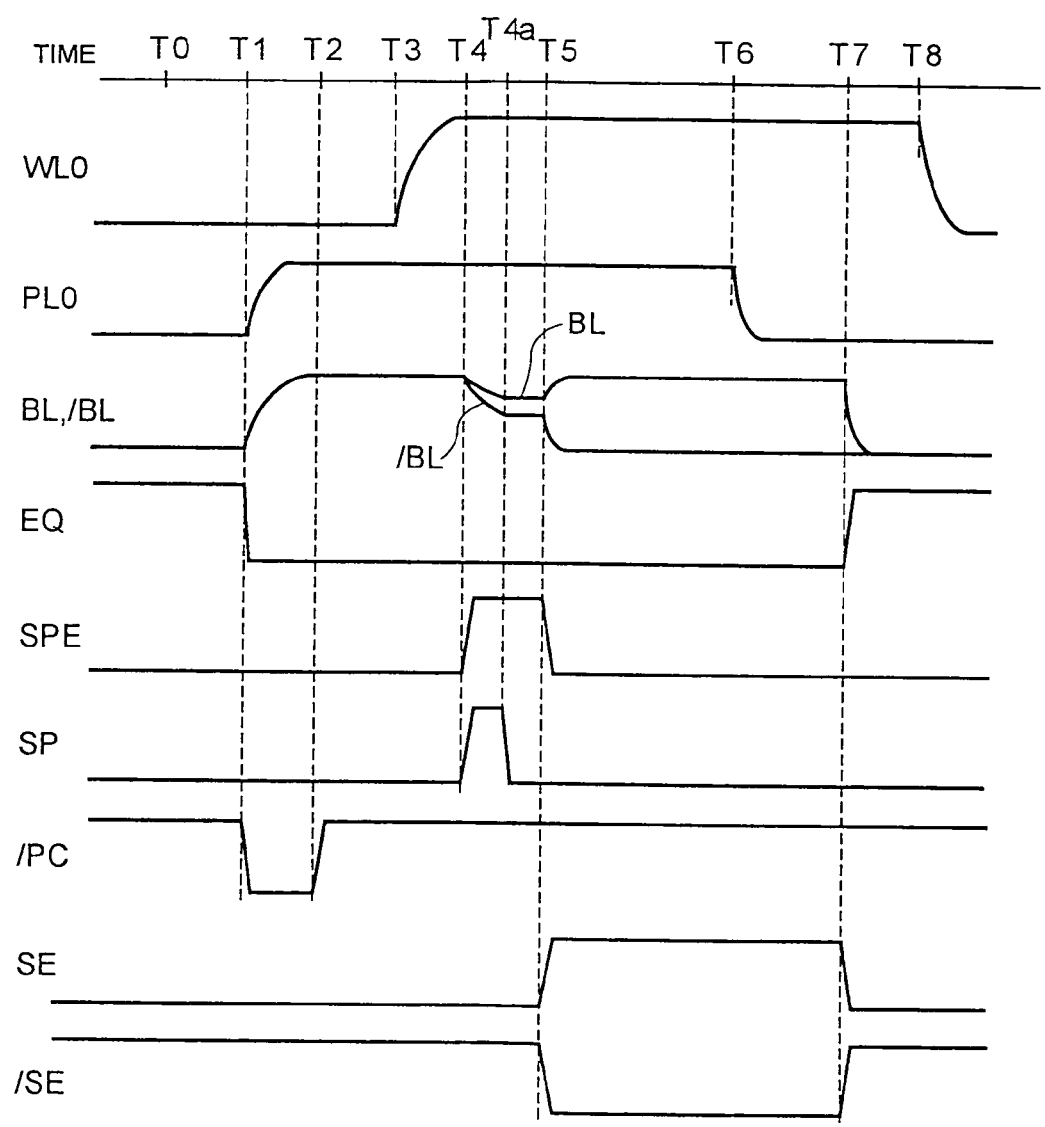
FIG. 8 is a signal waveform diagram showing a read operation in the ferroelectric memory of FIG. 7.

FIG. 8 is a signal waveform diagram showing a read operation in the ferroelectric memory of FIG. 7.

In FIG. 8, the operation between times T0 and T3 is the same as in the ferroelectric memory of FIG. 1 (that is, the signal waveforms of FIG. 5). During this interval, the bit line expansion signal SPE output from the timing control circuit 60A is "L".

At time T4, the bit line expansion signal SPE output from the timing control circuit 60A goes to "H". At this time, the bit lines BL and /BL are both at "H", so that the signal SP output from the AND circuit 73 of the bit line expansion circuit 70 is "H", and the NMOS transistors 71, 72 are in the turned-on state. As a result, the bit lines BL and /BL are connected to ground potential GND, the charge which had been accumulated in the parasitic capacitances of the bit lines BL and /BL is discharged, and the potentials fall. At this time the ferroelectric capacitors Ca0, Cb0 in which are maintained remanent polarizations of opposite polarities, are connected to the bit lines BL and /BL via the cell transistors Ma0 and Mb0 in the turned-on state . Consequently the remanent polarizations of the ferroelectric capacitors Ca0, Cb0 causes the potential rates of decline of the bit lines BL and /BL to differ.

At time T4a, when the potential of one of the bit lines BL and /BL falls below the logic threshold level of the AND circuit 73, the signal SP output from the AND circuit 73 changes to "L". As a result, the NMOS transistors 71, 72 are switched to the off state, the bit lines BL and /BL enter a floating state, and the drop in potential of the bit lines BL and /BL is stopped.

At time T5, the bit line expansion signal SPE is changed to "L" by the timing control circuit 60A, and the enable signals SE, /SE are set to "H" and "L" respectively. Accordingly, the bit lines BL and /BL are disconnected from ground potential GND, and the potential difference between the bit lines BL and /BL is applied as an input signal to the sense amp 30. Thereafter, the operation is the same as in FIG. 1.

In this way, the ferroelectric memory of the second embodiment has a bit line expansion circuit 70 which stops discharge at the time one of the bit lines BL and /BL goes to "L", when the bit lines BL and /BL are connected to ground potential GND to discharge the accumulated charge. As a result, it is easier to set the timing, and the read margin can be further increased, compared with the first embodiment in which the equalizing signal EQ is used to connect the bit lines BL and /BL to ground potential GND. Hence, there are the advantageous results that even at a low power supply voltage data can be read without errors, and moreover a complex circuit to set the timing is not needed, so that circuit design is simplified.

The timing control circuit 60A is designed such that after the bit line expansion signal SPE goes to "L" the enable signal SE is output; but a configuration is also possible in which the signal SP output from the bit line expansion circuit 70 is monitored, and the enable signal SE is immediately output when the signal SP goes to "L". As a result, the read time can be shortened.

Third Embodiment

Figure 9:
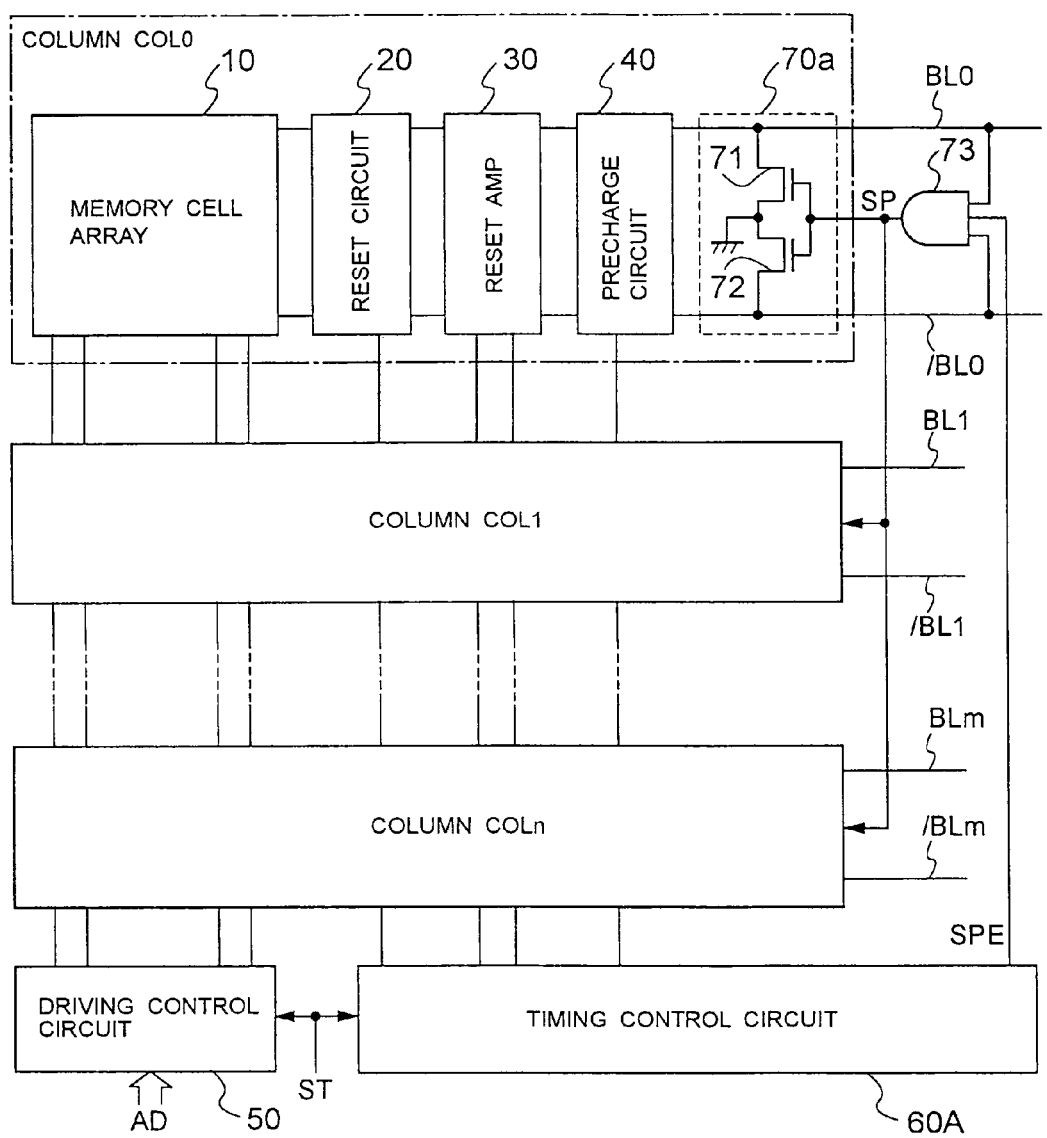
FIG. 9 shows the configuration of ferroelectric memory in a third embodiment of the present invention.

FIG. 9 shows the configuration of ferroelectric memory in a third embodiment of the present invention. Portions common to portions in FIG. 7 are assigned common symbols.

The ferroelectric memory in FIG. 7 is configured to store one bit of data specified by an address signal AD; the ferroelectric memory in FIG. 9 is configured to read and write a plurality of bits of data in parallel.

The ferroelectric memory includes a plurality of bit line pairs BLj, /BLj (where j=0 to m) corresponding to columns COL0 to COLm; each bit line pair is provided, similar to FIG. 7, with a memory cell array 10, a reset circuit 20, a sense amp 30, and a precharge circuit 40. Further, each bit line pair BLj, /BLj is connected to a corresponding bit line expansion circuit 70a, which is a third reset circuit. The bit line expansion circuit 70a comprises NMOS transistors 71, 72, connected between the bit lines BLj, /BLj and ground potential GND.

The bit lines BL0, /BL0 are connected to the first and second inputs of a three-input AND circuit 73; a bit line expansion signal SPE, which is a second equalizing signal, is applied to the third input of this AND circuit 73 from the timing control circuit 60A. A signal SP which is a third equalizing signal is output from the AND circuit 73, and is applied in common to the gates of the NMOS transistors 71, 72 in the bit line expansion circuit 70a in the columns COL0 to COLm. Otherwise the configuration is the same as in FIG. 7.

Other than the common use in columns COL0 to COLm of the signal SP generated based on the drop in potential of the bit lines BL0, /BL0 for column COL0, the operation of the ferroelectric memory is the same as that of the ferroelectric memory in FIG. 7.

Thus, in addition to the advantages of the second embodiment, the ferroelectric memory of the third embodiment is configured such that the signal SP is applied in common to a plurality of columns COL0 to COLm, and has the advantage that the circuit scale can be reduced compared with cases in which bit line expansion circuits 70 are provided for each column.

Fourth Embodiment

Figure 10:
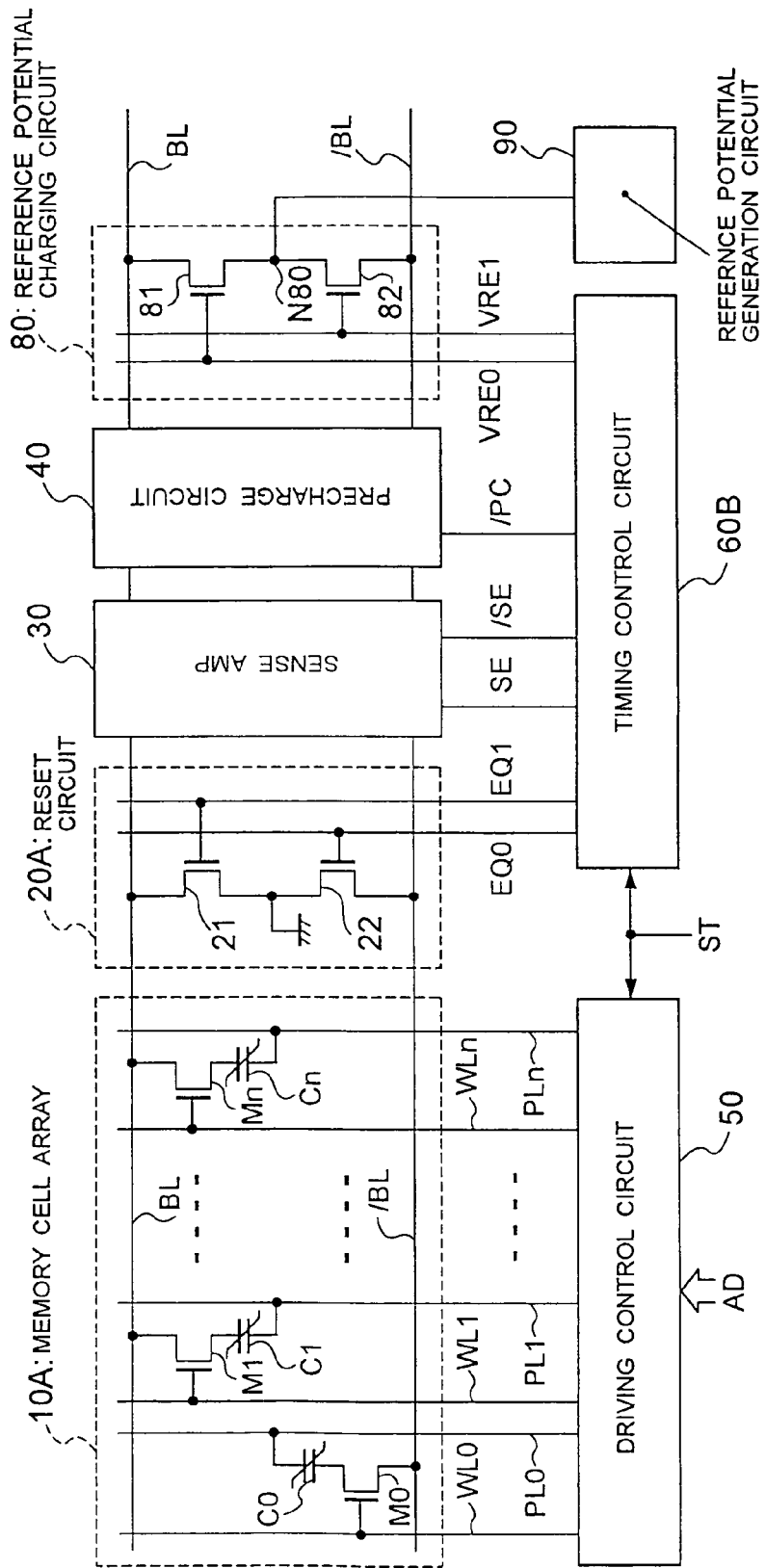
FIG. 10 shows the configuration of ferroelectric memory in a fourth embodiment of the present invention.

FIG. 10 shows the configuration of ferroelectric memory in a fourth embodiment of the present invention. Portions which are common to portions in FIG. 1 are assigned common symbols.

The ferroelectric memory of FIG. 1 has a 2T2C type memory cell array 10, which uses a pair of ferroelectric capacitors Cai, Cbi in which remanent polarizations of opposite polarity are induced to store one bit of data, and a pair of cell transistors Mai, Mbi to turn on and off the connection between the ferroelectric capacitors and the bit lines BL and /BL; whereas the ferroelectric memory in the fourth embodiment has a 1T1C type memory cell array 10A.

The memory cell array 10A has a plurality of word lines WLi and plate lines PLi (where i=0 to n), arranged to intersect the bit lines BL and /BL. Cell transistors Mi and ferroelectric capacitors Ci are connected in series between the bit line /BL and even-numbered plate lines PLi; the gates of the cell transistors Mi are connected to the word lines WLi. The cell transistors Mi and the ferroelectric capacitors Ci are connected in series between the bit line BL and odd-numbered plate lines PLi; the gates of the cell transistors Mi are connected to the word lines WLi. The word lines WLi and the plate lines PLi are connected to a driving control circuit 50 similar to that in FIG. 1, and are driven with predetermined timing based on address signals AD.

Further, the ferroelectric memory has a sense amp 30 and precharge circuit 40 similar to FIG. 1, a reset circuit 20A and timing control circuit 60B with functions somewhat different from those in FIG. 1, and a newly provided reference potential charging circuit 80 and a reference potential generation circuit 90.

The reset circuit 20A is driven by the equalizing signals EQ0, EQ1 applied by the timing control circuit 60B, and separately sets the bit lines /BL and BL to ground potential GND, to discharge the charge accumulated in the parasitic capacitances between the bit lines /BL, BL and ground potential GND.

The reference potential charging circuit 80 applies a reference potential VREF to the bit lines BL and /BL, according to control signals VRE0, VRE1 applied by the timing control circuit 60B. The reference potential charging circuit 80 comprises NMOS transistors 81, 82 connected between the bit lines BL and /BL, respectively, and the node N80; the control signals VRE0, VRE1 are respectively applied to the gates of the NMOS transistors 81, 82.

The reference potential generation circuit 90 generates a reference potential VREF to serve as reference for data reading. The reference potential VREF is set to an intermediate level between Vb0 and Vb1 which are the read potentials for the bit lines BL and /BL. The output of the reference potential generation circuit 90 is connected to the node N80 of the reference potential charging circuit 80.

When an operation start signal ST is applied, the timing control circuit 60B generates, with predetermined timing, equalizing signals EQ0, EQ1, enable signals SE, /SE, a precharge signal /PC, and control signals VRE0 and VRE1, and applies these signals to the reset circuit 20A, the sense amp 30, the precharge circuit 40, and the reference potential charging circuit 80, respectively.

Figure 11:
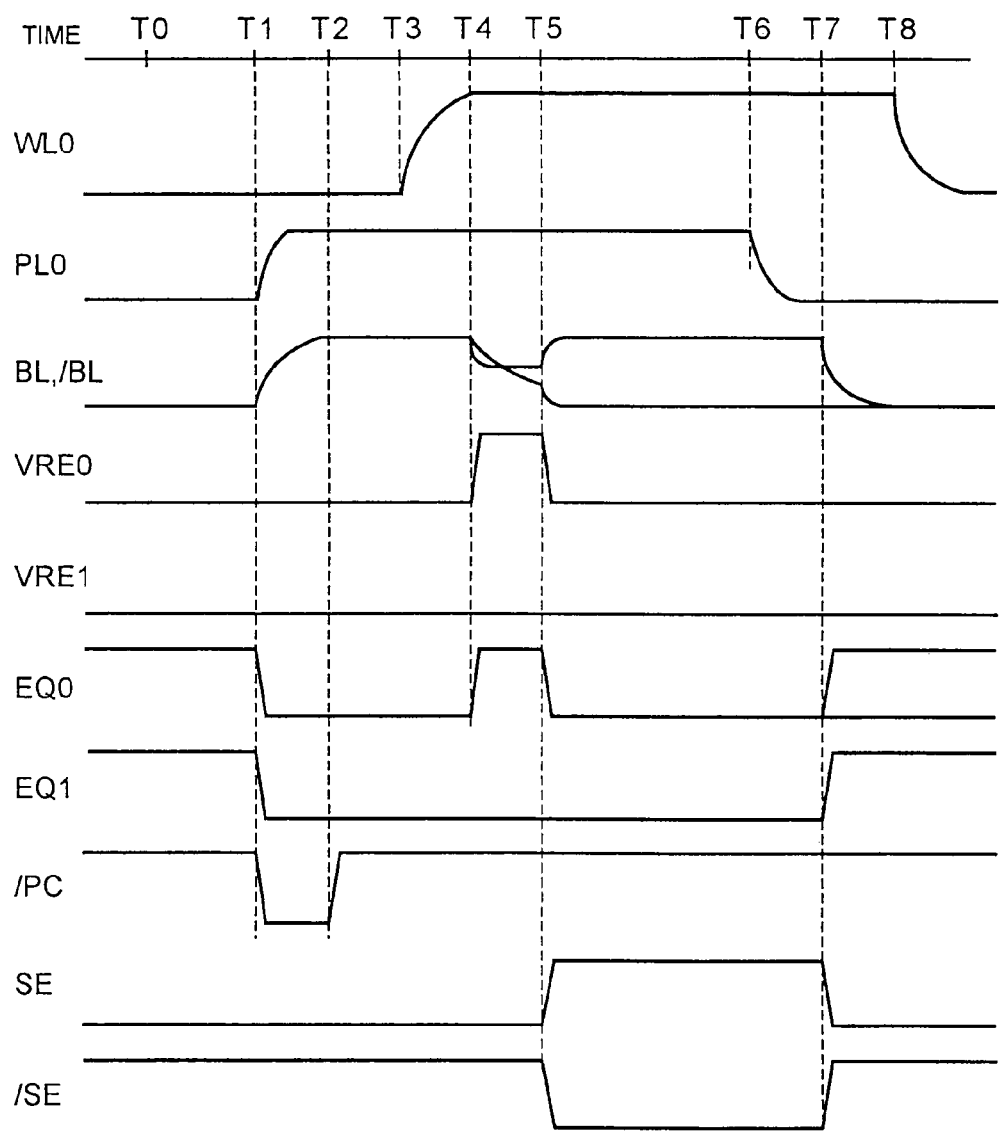
FIG. 11 is a signal waveform diagram showing a read operation in the ferroelectric memory of FIG. 10.

FIG. 11 is a signal waveform diagram showing a read operation in the ferroelectric memory of FIG. 10.

During standby (time T0), the word lines WLi and the plate lines PLi are all at "L". The equalizing signals EQ0, EQ1 of "H" are applied to the reset circuit 20A, and the bit lines BL and /BL are connected to ground potential GND to be set at "L". Enable signals SE, /SE of "L" and "H", respectively, are applied to the sense amp 30, A precharge signal /PC of "H" is applied to the precharge circuit 40, and operation of both the circuits is stopped. Control signals VRE0 and VRE1 of "L" are applied to the reference potential generation circuit 90, and output of the reference potential VREF to the bit lines BL and /BL is stopped.

When a read operation is started at time T1, the driving control circuit 50 drives the plate line (here, PL0) to "H" according to the address signal AD. The timing control circuit 60B sets the equalizing signals EQ0, EQ1 and precharge signal /PC to "L". As a result, the bit lines BL and /BL increase to the power supply potential VDD.

At time T2, the precharge signal /PC is changed to "H", and the bit lines BL and /BL enter a floating state.

At time T3, the driving control circuit 50 drives the word line WL0 to the word line potential VWL. As a result, the cell transistor M0 enters the turned-on state, but the potentials of the bit lines BL and /BL do not change.

At time T4, the equalizing signal EQ0 and the control signal VRE0 are set to "H" by the timing control circuit 60B. As a result, the bit line /BL is connected to ground potential GND, and the reference potential VREF is applied to the bit line BL. The charge which had accumulated in the parasitic capacitances of the bit lines BL and /BL is discharged, and the potentials drop. At this time, the ferroelectric capacitor C0 is connected, via the turned-on cell transistor M0, to the bit line /BL. Consequently, due to the polarity of the remanent polarization on the ferroelectric capacitor C0, the potential rate of decline of the bit line /BL is different.

At time T5, the equalizing signal EQ0 and the control signal VRE0 are set to "L" by the timing control circuit 60B, and the enable signals SE, /SE are set to "H" and "L" respectively. As a result, the bit lines BL and /BL are disconnected from ground potential GND and from the reference potential VREF, and the potential difference between the bit lines BL and /BL is applied to the sense amp 30 as the input signal. The sense amp 30 amplifies the potential difference between the bit lines BL and /BL, so that the levels of the bit lines BL and /BL go to, for example, "H" and "L". As a result, the bit lines BL and /BL output the data that had been stored in the ferroelectric capacitor C0.

At time T6, the plate line PL0 is returned to ground potential GND. As a result, the potential of the bit line /BL is applied to the ferroelectric capacitor C0, and rewriting is performed. Then, at time T7 the equalizing signals EQ0, EQ1 are changed to "H" and the bit lines BL and /BL are changed to "L", and in addition the enable signals SE and /SE are driven to "L" and to "H" respectively, to halt operation of the sense amp 30. And at time T8, the word line WL0 is changed to "L", and the data read operation is terminated.

A data write operation is performed by forced complementary driving of the bit lines BL and /BL based on the write data from a data writing circuit, not shown (a circuit having greater driving capacity than the sense amp 30), during the time period-from time T5 to time T6 in FIG. 11.

In this way, the ferroelectric memory of the fourth embodiment has a precharge circuit 40 which precharges the bit lines BL and /BL to the power supply potential VDD before driving the word line WLi at the start of a read operation; a reset circuit 20A which connects the read-side bit line /BL (or BL) to ground potential GND for a fixed length of time after driving the word line WLi; and a reference potential charging circuit 80 which applies a reference potential VREF to the bit line BL (or /BL) on the side opposite the read side. As a result, when the bit line /BL (or BL) is grounded for a fixed length of time, the potential difference occurring between the bit lines BL and /BL no longer depends on the parasitic capacitances of the bit lines. Hence advantages similar to those of the first embodiment are obtained. Further, one bit can be stored in a single ferroelectric capacitor C, so that there is the advantage that the memory capacity can be increased compared with the ferroelectric memory of the first embodiment.

Fifth Embodiment

Figure 12:
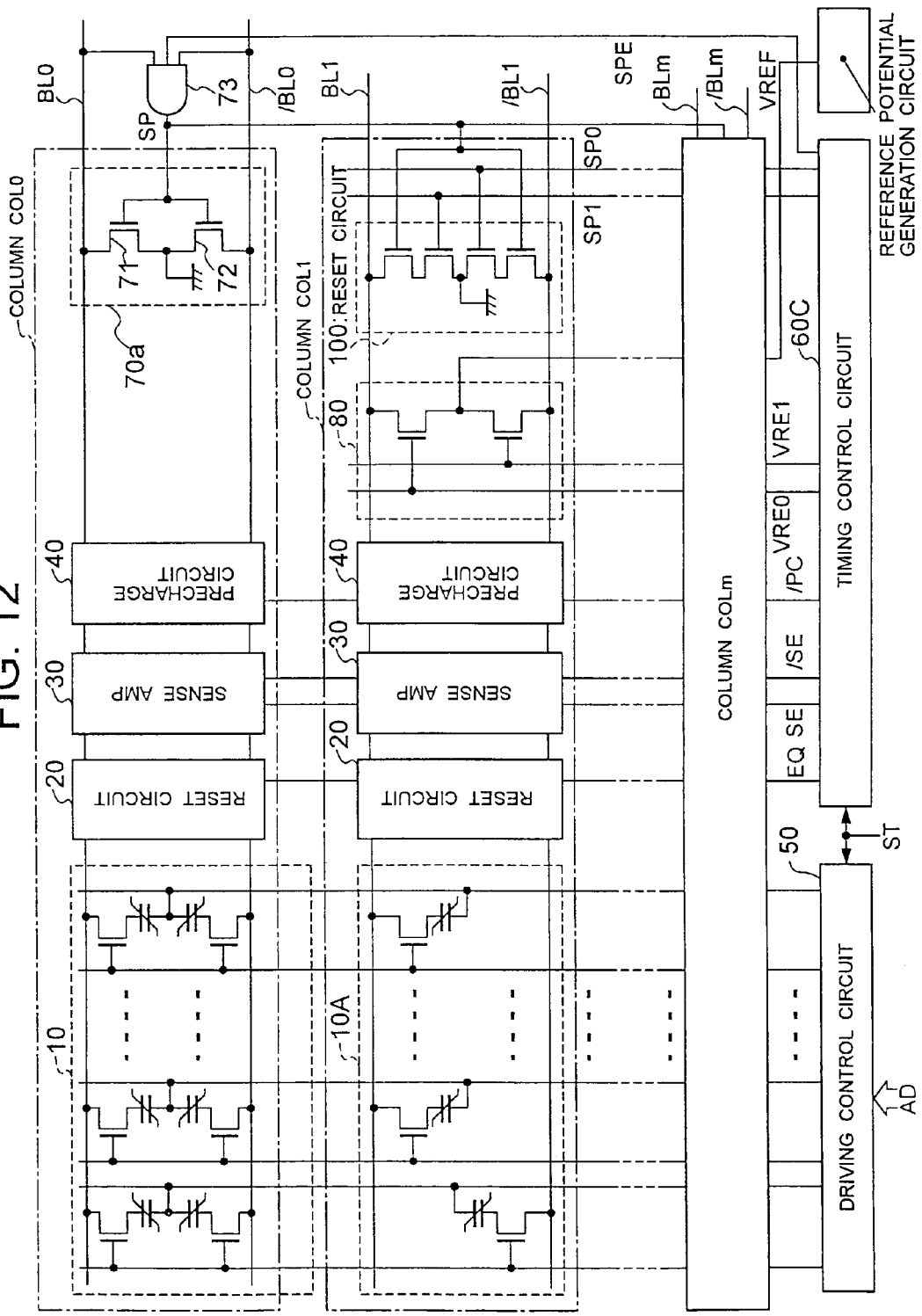
FIG. 12 shows the configuration of a ferroelectric memory in a fifth embodiment of the present invention; and, FIG. 13 is a signal waveform diagram showing a read operation in the ferroelectric memory of FIG. 12.

FIG. 12 shows the configuration of ferroelectric memory in a fifth embodiment of the present invention. Portions common to portions in FIG. 9 and FIG. 10 are assigned common symbols.

Similar to the ferroelectric memory of the third embodiment, the ferroelectric memory has a plurality of bit lines BLj, /BLj (where j=0 to m) corresponding to the columns COL0 to COLm, and is configured to enable reading and writing in parallel of a plurality of bits of data.

Similarly to FIG. 9, the bit line pair BL0, /BL0 for column COL0 is provided with a 2T2C type memory cell array 10, a reset circuit 20, a sense amp 30, a precharge circuit 40, a bit line expansion circuit 70a which is a second reset circuit, and an AND circuit 73.

On the other hand, each of the bit line pairs BL and /BL for the columns COL1 to COLm is provided with a 1T1C type memory cell array 10A, a reset circuit 20, a sense amp 30, a precharge circuit 40, a reference potential charging circuit 80, and a third reset circuit 100.

The reset circuit 100 selectively connects the bit lines BL and /BL to ground potential GND according to control signals SP0, SP1 applied by the timing control circuit 60C when the signal SP output from the AND circuit 73 is "H". The other configurational elements are the same as in FIG. 9 and FIG. 10.

Figure 13:
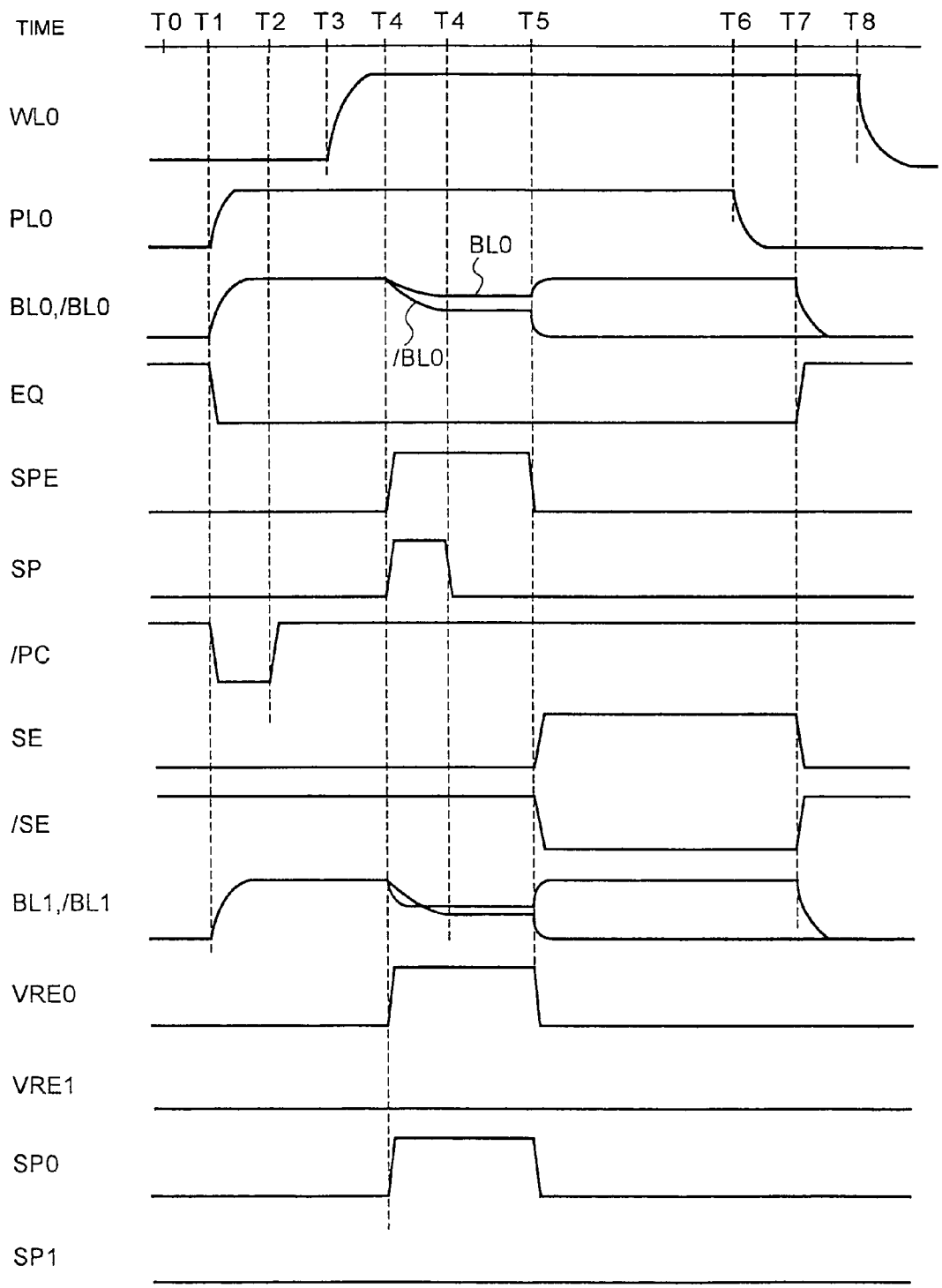

FIG. 13 is a signal waveform diagram showing a read operation in the ferroelectric memory of FIG. 12.

As shown in FIG. 13, the operation of column COL0 (that is, bit lines BL0, /BL0) in the ferroelectric memory is the same as the ferroelectric memory of FIG. 7 (that is, FIG. 8). On the other hand, the operation of the columns COL1 to COLm (for example, bit lines BL1, /BL1) in this ferroelectric memory is substantially the same as in the ferroelectric memory of FIG. 10 (that is, FIG. 11).

However, at time T4a, the potential of either one of the bit lines BL0, /BL0 falls below the logic threshold level of the AND circuit 73, and when the signal SP output from the AND circuit 73 changes to "L", the bit lines BL and /BL all enter a floating state even when the control signals SP0, SP1 are "H", so that the fall in potential of the bit lines BL and /BL is halted.

Then, at time T5 the data of the address specified by the address signal AD is read to each of the bit lines BLj, /BLj by the sense amps 30 of each of columns COL0 to COLm.

As described above, the ferroelectric memory of the fifth embodiment is configured with the columns COL1 to COLm in the ferroelectric memory of the third embodiment having the same 1T1C type memory cell array 10A as in the fourth embodiment. Thus, the ferroelectric memory of the fifth embodiment has the advantage of the third embodiment as well as that of the fourth embodiment. That is, the read margin can be ensured even when the power supply potential VDD is lowered, and in addition to the advantage of being able to read data without error even at a low power supply voltage, there are the further advantages that large storage capacities are possible without increasing the circuit scale, and that a complex timing setting circuit is unnecessary.

In the timing control circuit 60C, after the bit line expansion signal SPE has gone to "L", the enable signal SE is output; but a configuration is possible in which the signal SP output from the AND circuit 73 is monitored, and when the signal SP goes to "L", the enable signal SE is immediately output. Accordingly, the read time can be shortened.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2005-152069 which is hereby incorporated by reference.

What is claimed is:

1. A ferroelectric memory, comprising:
a memory cell array having complementary first and second bit lines, a plurality of sets of a word line and a plate line provided to intersect the bit lines, and a ferroelectric capacitor connected between the first and second bit lines and a plate line via a transistor which is controlled to be turn on and off by a corresponding word line;
a reset circuit which connects the first and second bit lines to ground potential while an equalizing signal is being applied;
a precharge circuit which connects the first and second bit lines to a power supply potential while a precharge signal is being applied;
a sense amp which amplifies the potential difference between the first and second bit lines to output signals at complementary first and second logic levels to the first and second bit lines, while an enable signal is being applied;
driving control means which drives a relevant plate line according to an applied address signal when read or write access to the memory cell array is performed, and drives the corresponding word line after a predetermined time has elapsed; and
timing control means which outputs the equalizing signal when there is no access, outputs the precharge signal while halting the equalizing signal when access is started, halts the precharge signal before the predetermined time elapses, outputs the equalizing signal with a predetermined pulse width after a fixed time has elapsed from the start of driving of the word line, and outputs the enable signal after the equalizing signal is halted.

2. A ferroelectric memory according to claim 1, wherein said timing control means outputs the precharge signal to said precharge circuit so that the first and second bit lines are charged to a "H" (high) level.

3. A ferroelectric memory according to claim 1, wherein said equalizing signal has a time width so that the potential of either one of the first and second bit lines is decreased to a "L" (low) level.

4. A ferroelectric memory, comprising:
a memory cell array having complementary first and second bit lines, a plurality of sets of a word line and a plate line provided to intersect the bit lines, and a ferroelectric capacitor connected between the first and second bit lines and a plate line via a transistor which is controlled to be turn on and off by a corresponding word line;
a first reset circuit which connects the first and second-bit lines to ground potential while a first equalizing signal is being applied;
a precharge circuit which connects the first and second bit lines to a power supply potential while a precharge signal is being applied;
a sense amp which amplifies the potential difference between the first and second bit lines, and outputs signals at complementary first and second logic levels to the first and second bit lines, while an enable signal is being applied;
a second reset circuit which outputs a third equalizing signal and connects the first and second bit lines to ground potential while a second equalizing signal is being applied and the levels of both of the first and second bit lines are equal to or greater than a predetermined level;
driving control means which drives the relevant plate line according to an applied address signal when read or write access to the memory cell array is performed, and drives the corresponding word line after a predetermined time has elapsed; and
timing control means which outputs the first equalizing signal when there is no access, halts output of the first equalizing signal and outputs the precharge signal when access is started, halts the precharge signal before the predetermined time elapses, outputs the second equalizing signal with a predetermined pulse width after a fixed time has elapsed from the start of driving of the word line, and after the second equalizing signal or the third equalizing signal is halted, outputs the enable signal.

5. A ferroelectric memory according to claim 4, wherein said timing control means outputs the precharge signal to said precharge circuit so that the first and second bit lines are charged to a "H" (high) level.

6. A ferroelectric memory according to claim 4, wherein said third equalizing signal has a time width so that the potential of either one of the first and second bit lines is decreased to a "L" (low) level.

7. A ferroelectric memory, comprising:
first through m-th memory cell arrays (where m is greater than 1) having respectively complementary first and second bit lines, a plurality of sets of a word line and a plate line provided to intersect the bit lines, and a ferroelectric capacitor connected between the first and second bit lines and a plate line via a transistor which is controlled to be turn on and off by a corresponding word line;
a first reset circuit, provided corresponding to each of the memory cell arrays, which connects the first and second bit lines to ground potential while a first equalizing signal is being applied;
a precharge circuit, provided corresponding to each of the memory cell arrays, which connects the first and second bit lines to a power supply potential while a precharge signal is being applied;
a sense amp, provided corresponding to each of the memory cell arrays, which amplifies the potential difference between the first and second bit lines, and outputs signals at complementary first and second logic levels to the first and second bit lines, while an enable signal is being applied;
a second reset circuit, provided corresponding to the first memory cell array, which outputs a third equalizing signal and connects the first and second bit lines to ground potential while a second equalizing signal is being applied thereto and the levels of both of the first and second bit lines are equal to or greater than a fixed level;
a third reset circuit, provided corresponding to the second through the m-th memory cell arrays, which connects the first and second bit lines to ground potential while the third equalizing signal is being applied;
driving control means which drives the relevant plate line according to an applied address signal when read or write access to each of the memory cell arrays is performed, and drives the corresponding word line after a predetermined time has elapsed; and
timing control means which outputs the first equalizing signal when there is no access, halts output of the first equalizing signal and outputs the precharge signal when access is started, halts the precharge signal before the predetermined time elapses, outputs the second equalizing signal with a predetermined pulse width after a fixed time has elapsed from the start of driving of the word line, and after the second equalizing signal or the third equalizing signal is halted, outputs the enable signal.

8. A ferroelectric memory according to claim 7, wherein said timing control means outputs the precharge signal to said precharge circuit so that the first and second bit lines are charged to a "H" (high) level.

9. A ferroelectric memory according to claim 7, wherein said third equalizing signal has a time width so that the potential of either one of the first and second bit lines is decreased to a "L" (low) level.

10. A ferroelectric memory, comprising:
a memory cell array having complementary first and second bit lines, a plurality of sets of a word line and a plate line provided to intersect the bit lines, and a ferroelectric capacitor connected between the first and second bit lines and a plate line via a transistor which is controlled to be turn on and off by a corresponding word line;
a reset circuit which connects the first or second bit line to ground potential while an equalizing signal is being applied;
a precharge circuit which connects the first and second bit lines to a power supply potential while a precharge signal is being applied;
a sense amp which amplifies the potential difference between the first and second bit lines, and outputs signals at complementary first and second logic levels to the first and second bit lines, while an enable signal is being applied;
a reference potential generation circuit which generates a reference potential to determine the logic levels of the first and second bit lines;
a reference potential charging circuit which outputs the reference potential to the first or second bit line while a reference potential output control signal is being applied;
driving control means which drives the relevant plate line according to an applied address signal when read or write access to the memory cell array is performed, and drives the corresponding word line after a predetermined time has elapsed; and
timing control means which outputs the equalizing signal when there is no access, halts output of the equalizing signal and outputs the precharge signal when access is started, halts the precharge signal before the predetermined time elapses, outputs the equalizing signal with a predetermined pulse width after a fixed time has elapsed from the start of driving of the word line, and outputs the enable signal after the equalizing signal and the reference potential output control signal are halted.

11. A ferroelectric memory according to claim 10, wherein said timing control means outputs the precharge signal to said precharge circuit so that the first and second bit lines are charged to a "H" (high) level.

12. A ferroelectric memory according to claim 10, wherein said equalizing signal has a time width so that the potential of either one of the first and second bit lines is decreased to a "L" (low) level.

13. A ferroelectric memory, comprising:
a first memory cell array having complementary first and second bit lines, a plurality of sets of a word line and a plate line provided to intersect the bit lines, and a ferroelectric capacitor connected between the first and second bit lines and a plate line via a transistor which is controlled to be turn on and off by a corresponding word line;

second through m-th memory cell arrays, having complementary first and second bit lines, a plurality of sets of a word line and a plate line provided to intersect the bit lines, and a ferroelectric capacitor, connected via a transistor which is controlled to turn on and off by the corresponding word line between the first or second bit line and a plate line;
a first reset circuit, provided corresponding to each of the memory cell arrays, which connects the first and second bit lines to ground potential while a first equalizing signal is being applied;
a precharge circuit, provided corresponding to each of the memory cell arrays, which connects the first and second bit lines to a power supply potential while a precharge signal is being applied;
a sense amp, provided corresponding to each of the memory cell arrays, which amplifies the potential difference between the first and second bit lines, and outputs signals at complementary first and second logic levels to the first and second bit lines, while an enable signal is being applied;
a second reset circuit, provided corresponding to the first memory cell array, which outputs a third equalizing signal and connects the first and second bit lines to ground potential while a second equalizing signal is being applied thereto and the levels of both of the first and second bit lines are equal to or greater than a fixed level;
a third reset circuit, provided corresponding to the second through the m-th memory cell arrays, which connects the first or second bit line to ground potential while the third equalizing signal is being applied;
a reference potential charging circuit, provided corresponding to the second through the m-th memory cell arrays, which outputs a reference potential to the first or second bit line while a reference potential output control signal is being applied;
a reference potential generation circuit, which generates the reference potential for use in judging the logical levels of the first and second bit lines;
driving control means which drives the relevant plate line according to an applied address signal when read or write access to each of the memory cell arrays is performed, and drives the corresponding word line after a predetermined time has elapsed; and
timing control means, which outputs the first equalizing signal when there is no access, halts output of the first equalizing signal and outputs the precharge signal when access is started, halts the precharge signal before the predetermined time elapses, outputs the second equalizing signal with a predetermined pulse width after a fixed time has elapsed from the start of driving of the word line, and after the second equalizing signal or the third equalizing signal is halted, outputs the enable signal.

14. A ferroelectric memory according to claim 13, wherein said timing control means outputs the precharge signal to said precharge circuit so that the first and second bit lines are charged to a "H" (high) level.

15. A ferroelectric memory according to claim 13, wherein said third equalizing signal has a time width so that the potential of either one of the first and second bit lines is decreased to a "L" (low) level.

* * * * *